US011444139B2

(12) United States Patent
Wang et al.

(10) Patent No.: US 11,444,139 B2
(45) Date of Patent: Sep. 13, 2022

(54) DISPLAY PANEL PROVIDING PLANARIZATION LAYER ON PIXEL DEFINING LAYER AROUND LIGHT EMITTING FUNCTIONAL LAYER, DISPLAY DEVICE, AND MANUFACTURING METHOD OF THE DISPLAY PANEL

(71) Applicant: WUHAN CHINA STAR OPTOELECTRONICS SEMICONDUCTOR DISPLAY TECHNOLOGY CO., LTD., Hubei (CN)

(72) Inventors: Lei Wang, Hubei (CN); Zesheng Chen, Hubei (CN)

(73) Assignee: WUHAN CHINA STAR OPTOELECTRONICS SEMICONDUCTOR DISPLAY TECHNOLOGY CO., LTD., Hubei (CN)

( * ) Notice: Subject to any disclaimer, the term of this patent is extended or adjusted under 35 U.S.C. 154(b) by 275 days.

(21) Appl. No.: 16/753,038

(22) PCT Filed: Nov. 18, 2019

(86) PCT No.: PCT/CN2019/119054
§ 371 (c)(1),
(2) Date: Apr. 2, 2020

(87) PCT Pub. No.: WO2021/036007
PCT Pub. Date: Mar. 4, 2021

(65) Prior Publication Data
US 2021/0066414 A1 Mar. 4, 2021

(30) Foreign Application Priority Data

Aug. 28, 2019 (CN) .......................... 201910801010.8

(51) Int. Cl.
*H01L 33/00* (2010.01)
*H01L 27/32* (2006.01)
*H01L 51/52* (2006.01)

(52) U.S. Cl.
CPC ...... *H01L 27/3246* (2013.01); *H01L 51/5206* (2013.01); *H01L 51/5271* (2013.01); *H01L 2227/323* (2013.01)

(58) Field of Classification Search
CPC ............ H01L 27/3246; H01L 51/5206; H01L 51/5271; H01L 2227/323
(Continued)

(56) References Cited

U.S. PATENT DOCUMENTS

2008/0252207 A1    10/2008  Yamazaki et al.
2009/0039773 A1*   2/2009   Jun ..................... H01L 27/3258
                                                    313/504
(Continued)

FOREIGN PATENT DOCUMENTS

CN    103000823 A    3/2013
CN    106941113 A    7/2017
CN    207868202 U    9/2018

*Primary Examiner* — Phuc T Dang
(74) *Attorney, Agent, or Firm* — Mark M. Friedman

(57) ABSTRACT

The present invention provides a display panel, a display device, and a manufacturing method of the display panel. The display panel includes a source drain layer, a first planarization layer, a second planarization layer, an anode layer, a light emitting functional layer, and a cathode layer which are sequentially stacked from bottom to top. The second planarization layer includes a light shielding structure and a first groove formed by the light shielding structure. The anode layer completely covers the first groove and is extended to cover a portion of the second planarization layer. The light emitting functional layer is disposed on the anode layer in the first groove.

10 Claims, 3 Drawing Sheets

(58) Field of Classification Search
USPC .......................................................... 257/98
See application file for complete search history.

(56) References Cited

U.S. PATENT DOCUMENTS

| | | |
|---|---|---|
| 2013/0001603 A1 | 1/2013 | Lim |
| 2015/0249119 A1* | 9/2015 | In ........................ H01L 27/3246 257/40 |
| 2017/0003786 A1* | 1/2017 | Kim ...................... G06F 3/0443 |
| 2018/0331325 A1 | 11/2018 | Zhang |
| 2020/0035773 A1* | 1/2020 | Cheng ................. H01L 27/3246 |

* cited by examiner

DISPLAY PANEL PROVIDING PLANARIZATION LAYER ON PIXEL DEFINING LAYER AROUND LIGHT EMITTING FUNCTIONAL LAYER, DISPLAY DEVICE, AND MANUFACTURING METHOD OF THE DISPLAY PANEL

FIELD OF INVENTION

The present invention relates to the field of displays, and in particular, to a display panel, a display device, and a manufacturing method of the display panel.

BACKGROUND OF INVENTION

Organic light emitting diodes (OLEDs) are more and more widely used due to advantages such as light weight, self-illumination, wide viewing angles, low driving voltages, high light emitting efficiency, low power consumption and fast response times.

A conventional organic light emitting diode display panel comprises an array substrate and a light emitting function layer thereon. A structure of the array substrate comprises a planarization layer, an anode layer, a pixel defining layer, and a supporting layer which are sequentially stacked from bottom to top. On one hand, since a light transmission of the pixel defining layer is strong, lateral light of the light emitting functional layer cannot be effectively blocked, so that the lateral light in the display panel turns into stray light through a reflection of a metal layer and refractions of other layers. For biometrics such as fingerprint recognitions, signal-to-noise ratios of products are reduced, and resulting in reduced recognition capability. On the other hand, since the light emitting function layer emits light in various directions, light absorptions are caused by absorptions and refractions of the film layers such as the pixel defining layer, and thus the light emitting efficiency is less than 20%. In order to obtain higher brightness, source powers must be increased, so power consumption is increased, and battery lives are reduced.

Therefore, it is necessary to provide a new display panel, a display device, and a manufacturing method of the display panel to overcome problems in the prior art.

Technical Problem

An object of the present invention is to provide a display panel, a display device, and a manufacturing method of the display panel, which improve a light emitting efficiency of an organic light emitting diode display panel and prevent an edge light leakage phenomenon, thereby reducing source powers and power consumption, and improving battery lives.

Technical Solution

In order to achieve the above object, the present invention provides a display panel comprising a source drain layer, a first planarization layer, a second planarization layer, an anode layer, a light emitting functional layer, and a cathode layer which are sequentially stacked from bottom to top. Specifically, the first planarization layer is disposed on the source drain layer. The second planarization layer is patterned and disposed on the first planarization layer, and the second planarization layer comprises a light shielding structure and a first groove formed by the light shielding structure. The anode layer is disposed on the second planarization layer, and the anode layer completely covers the first groove and is extended to cover a portion of the second planarization layer. The light emitting functional layer is disposed on the anode layer in the first groove. The cathode layer is disposed on the light emitting functional layer in the first groove.

Further, an angle formed between a first inclined plane of the first groove and an upper surface of the first planarization layer ranges from 45° to 55°, and the first inclined plane is an inclined plane formed by the second planarization layer.

Further, the display panel further comprises a pixel defining layer disposed on the second planarization layer and the anode layer, wherein the first groove forms a second groove after partially filling the pixel defining layer, the second groove is disposed around the first groove, and the anode layer is exposed on a bottom surface of the second groove. The light emitting functional layer is disposed on the anode layer in the second groove, and the cathode layer is disposed on the light emitting functional layer in the second groove.

Further, an angle formed between a second inclined plane of the second groove and an upper surface of the anode layer ranges from 45° to 55°, and the second inclined plane is an inclined plane formed by the pixel defining layer.

Further, a cross-sectional shape of the first groove or a cross-sectional shape of the second groove is an inverted trapezoid.

Further, a distance between the anode layer covering the first inclined plane of the first groove and the adjacent light emitting functional layer ranges from 1 um to 2 um.

Further, a thickness of the second planarization layer ranges from 1 um to 1.5 um.

The invention further provides a manufacturing method of a display panel, comprising the following steps:

forming a source drain layer;

forming a first planarization layer on the source drain layer;

forming a second planarization layer on the first planarization layer and patterning the second planarization layer, wherein the patterned second planarization layer has a light shielding structure and a first groove is formed by the light shielding structure;

forming an anode layer on the second planarization layer, wherein the anode layer completely covers the first groove and is extended to cover a portion of the second planarization layer;

forming a light emitting functional layer on the anode layer in the first groove; and forming a cathode layer on the light emitting functional layer in the first groove.

Further, after the step of forming the anode layer and before the step of forming the light emitting functional layer further comprises: forming a pixel definition layer on the second planarization layer and the anode layer, wherein the first groove forms a second groove after partially filling the pixel defining layer, the second groove is disposed around the first groove, and the anode layer is exposed on a bottom surface of the second groove; wherein the light emitting function layer is disposed on the anode layer in the second groove, and the cathode layer is disposed on the light emitting function layer in the second groove Further, the present invention further provides a display device comprising the above display panel.

Beneficial Effect

The beneficial effects of the invention are: providing a display panel, a display device, and a manufacturing method of the display panel, and providing a second planarization layer on an outer side of a pixel defining layer around a light emitting functional layer for blocking lateral light of the light emitting function layer, thereby preventing an edge light leakage phenomenon; and further adjusting a tilt angle of the second planarization layer adjacent to the light emitting function layer, and adjusting a distance from an edge of the second planarization layer to the light emitting function layer, thereby improving a light emitting efficiency of an organic light emitting diode display panel, which reduces source powers and power consumption, and increases battery lives.

Figure 1:
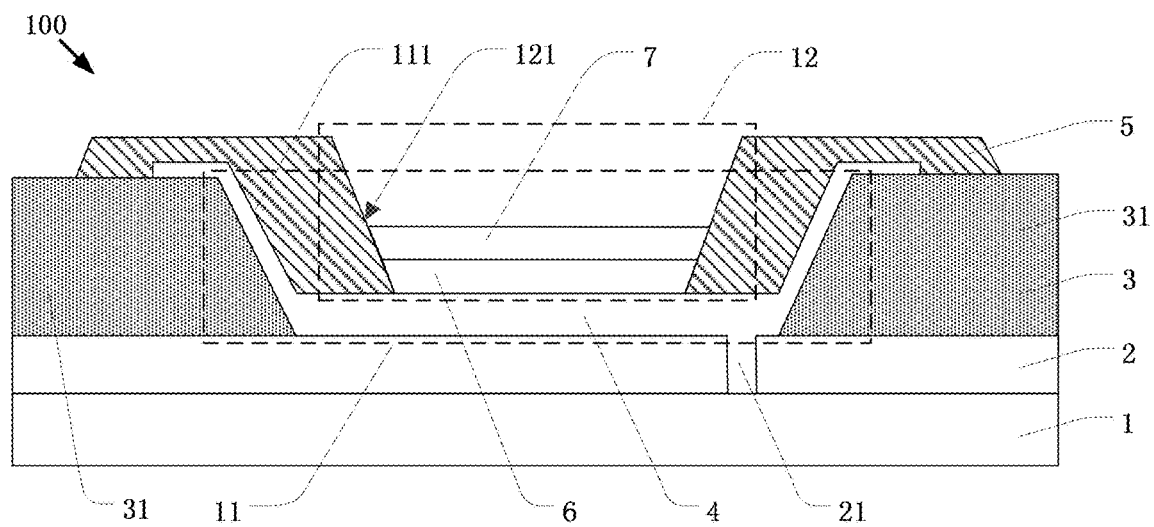
FIG. 1 is a schematic structural view of a display panel according to an embodiment of the present invention.

The reference numerals in the figure are identified as follows:

1: source drain layer; 2: first planarization layer; 3: second planarization layer; 4: anode layer; 5: pixel defining layer; 6: light emitting functional layer; 7: cathode layer; 11: first groove; 12: second groove; 31: light shielding structure; 21: via; 100: display panel; 111: first inclined plane; 121: second inclined plane.

DETAILED DESCRIPTION OF PREFERRED EMBODIMENTS

In the present invention, unless otherwise specifically defined and limited, a first feature is "on" or "under" a second feature may include that the first feature is in direct contact to the second feature, and may also include that the first feature and the second feature are not in direct contact but through additional features between them. Moreover, the first feature is "on," "above," and "under" the second feature includes the first feature is directly above and obliquely above the second feature, or merely indicating that the high of the first feature is higher than the second feature. The first feature is "below," "under," and "lower" the second feature includes the first feature is directly below and obliquely below the second feature, or merely indicating that the high of the first feature is less than the second feature.

Throughout the specification, the term "comprises" or "includes" is used to describe the presence of features and/or components described in the specification, and does not exclude the presence of one or more other features and/or one or more other components. It will be understood that when a layer, an area, a component or the like is referred to as being "on" another layer, another area or another component, the layer, area, component, etc. may be directly in another layer, another area or an intermediate layer, intermediate area or intermediate component may also be present on another component.

In the present invention, identical or corresponding components are denoted by same reference numerals, regardless of the figure number. In the specification, when a "first," "second," and the like may be the wording used to describe various components, these components need not limited to the above wording. The above terms are only used to distinguish one element from another distinguished.

Referring to FIG. 1, in an embodiment of the present invention, a display panel 100 comprising a source drain layer 1, a first planarization layer 2, a second planarization layer 3, an anode layer 4, a light emitting functional layer 6, and a cathode layer 7 which are sequentially stacked from bottom to top is provided. Specifically, the first planarization layer 2 is disposed on the source drain layer 1. The second planarization layer 3 is patterned and disposed on the first planarization layer 2, and the second planarization layer 3 comprises a light shielding structure 31 and a first groove 11 formed by the light shielding structure 31. The anode layer 4 is disposed on the second planarization layer 3, and the anode layer 4 completely covers the first groove 11 and is extended to cover a portion of the second planarization layer 3. The light emitting functional layer 6 is disposed on the anode layer 4 in the first groove 11. The cathode layer 7 is disposed on the light emitting functional layer 6 in the first groove 11.

The first planarization layer 2 is provided with a via 21, and the anode layer 4 is electrically connected to the source drain layer 1 through the via 21.

The light emitting function layer 6 comprises a plurality of light emitting elements. Preferably, the light emitting elements may be organic light emitting diode (OLED) elements, and each of the OLED elements are self-illuminated by providing corresponding currents. Preferably, the light emitting elements may also be liquid crystal display (LCD) elements. The LCD elements are packaged with a liquid crystal layer. After a voltage is supplied to the liquid crystal layer, an alignment direction of liquid crystal molecules can be changed, so that light emitted from a backlight is combined with internal components of the LCD to form an image in a display area.

In the embodiment, a pixel defining layer 5 is further disposed between the anode layer 4 and the light emitting function layer 6. Specifically, the pixel defining layer 5 is disposed on the second planarization layer 3 and the anode layer 4. The first groove 11 forms a second groove 12 after partially filling the pixel defining layer 5. The second groove 12 is disposed around the first groove 11, and the anode layer 4 is exposed on a bottom surface of the second groove 12. The light emitting functional layer 6 is disposed on the anode layer 4 in the second groove 12. The cathode layer 7 is disposed on the light emitting functional layer 6 in the second groove 7.

Wherein, a support layer (not shown) is further disposed on the upper surface of the pixel defining layer 5.

A corresponding simulation is performed on a structure of the display panel 100 according to the embodiment. The adjustment parameters include: an angle formed by a first inclined plane 111 of the first groove 11 and an upper surface of the first planarization layer 2, i.e. a taper (Taper) of the second planarization layer 3, a thickness (THK) of the second planarization layer 3, and a distance L between the anode layer 4 covering the first inclined plane of the first groove 11 and the adjacent light emitting functional layer 6.

Figure 2:
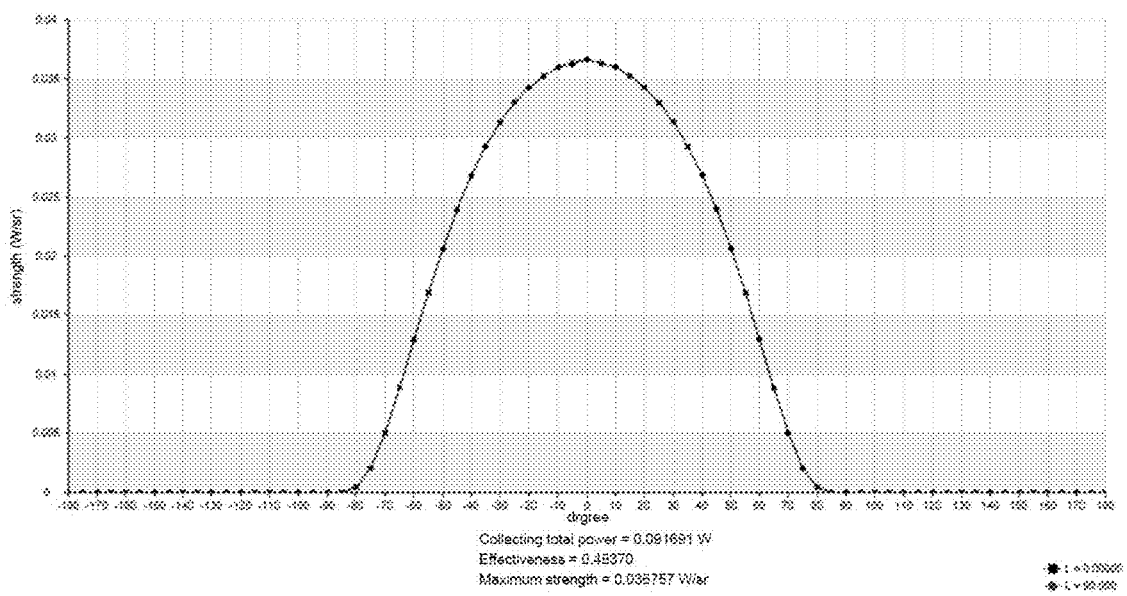
FIG. 2 is a graph showing a light intensity curve with angle changes of a light emitting functional layer of a conventional structural display panel.

As shown in FIG. 2, which is a simulation result of a graph showing a light intensity curve with angle changes of the light emitting functional layer 6 of a conventional structural display panel 100.

The specific simulation results of the display panel 100 in the embodiment are shown in Table 1-Table 3.

When Taper=45°, a change value ΔEL of light intensity of the light emitting function layer 6 is as shown in the following table:

TABLE 1

| L | THK. | | |
|---|---|---|---|
| | 1 um | 1.5 um | 2 um |
| | ΔEL | | |
| 1 um | +3.2% | +5.6% | +8.2% |
| 1.5 um | +2.6% | +5.0% | +7.5% |
| 2 um | +2.2% | +4.4% | +6.9% |

When Taper=55°, the change value ΔEL of the light intensity of the light emitting function layer 6 is as shown in the following table:

TABLE 2

| L | THK. | | |
|---|---|---|---|
| | 1 um | 1.5 um | 2 um |
| | ΔEL | | |
| 1 um | +3.8% | +6.7% | +9.5% |
| 1.5 um | +3.1% | +6.0% | +8.5% |
| 2 um | +2.6% | +5.3% | +8.1% |

When Taper=55°, the change value ΔEL of the light intensity of the light emitting function layer 6 is as shown in the following table:

TABLE 3

| L | THK. | | |
|---|---|---|---|
| | 1 um | 1.5 um | 2 um |
| | ΔEL | | |
| 1 um | +4.1% | +7.4% | +10.2% |
| 1.5 um | +3.5% | +6.7% | +9.6% |
| 2 um | +2.9% | +6.0% | +9.0% |

Through the simulation results and an actual comparison of the light intensity of the light emitting functional layer 6 with the angle changes, it is found that changing Taper, THK, and L all increases the light intensity of the light emitting functional layer 6. That is, the change value ΔEL of the light intensity of the light emitting function layer 6 is increased. However, when the lift is large, the light intensity of the light emitting function layer 6 is greatly deformed according to angle curves, and a sharp peak occurs at the edge, so that an edge strength is significantly improved, which may adversely affect.

Figure 3:
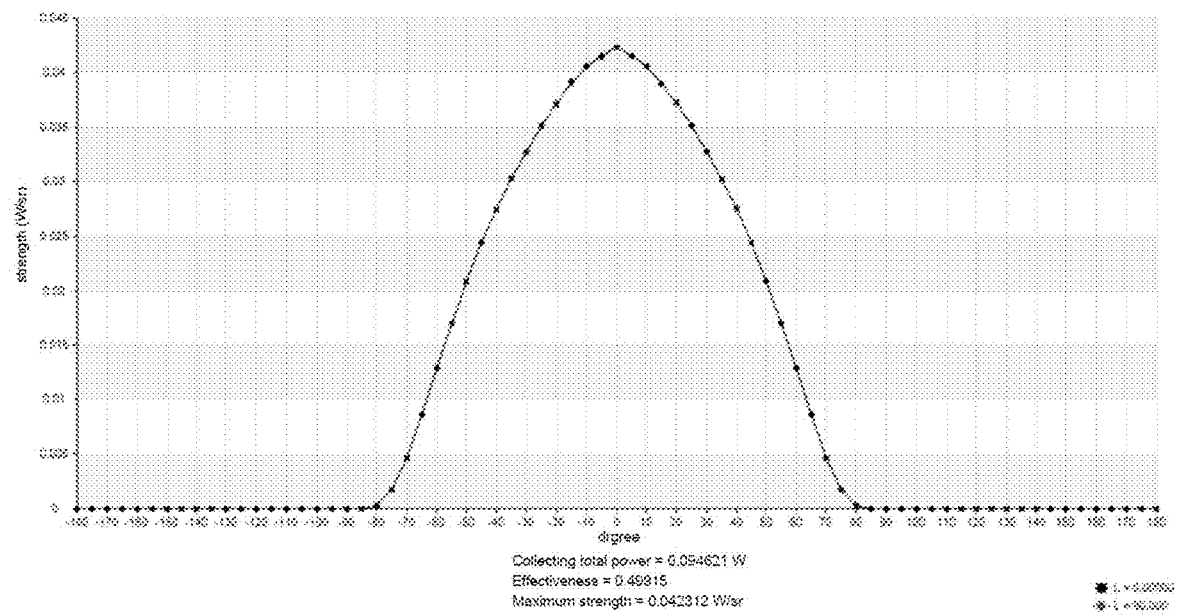
FIG. 3 is a graph showing a light intensity curve with angle changes of the light emitting functional layer when L=1 um-2 um, Taper=45°, THK=1.5 um.

Please refer to Table 1-Table 3 and FIG. 3, when L=1 um-2 um, Taper=45°, THK=1.5 μm, a light emitting efficiency of the light emitting functional layer 6 is increased by about 2.7%, and a shape of the overall light emitting curve of the light emitting functional layer 6 does not change much.

Figure 4:
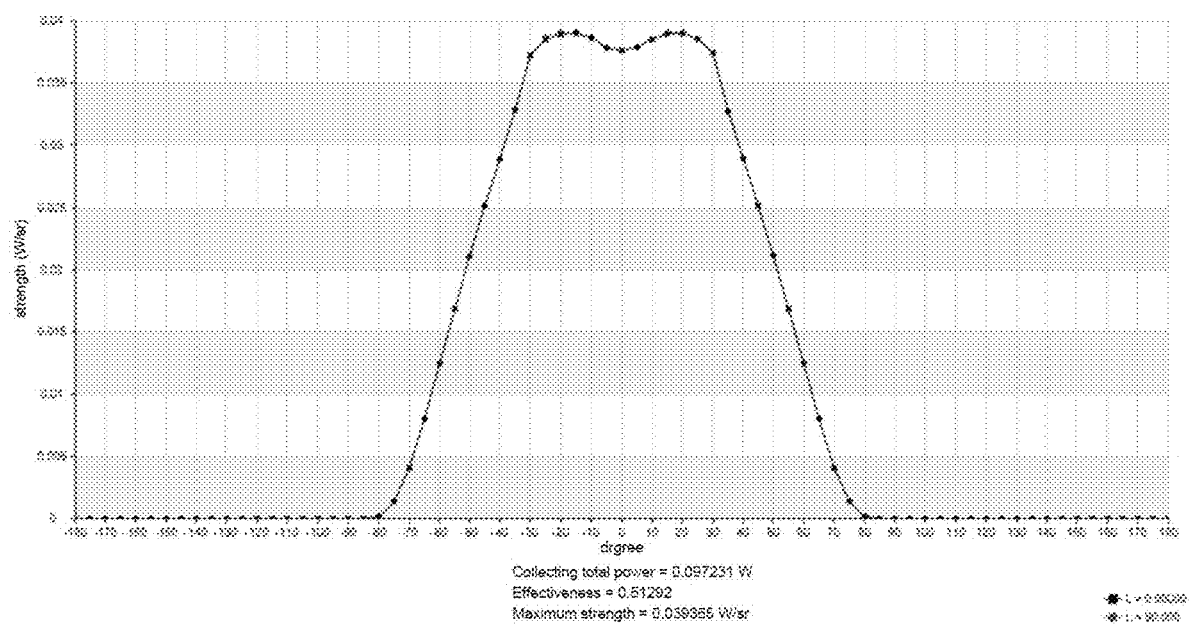
FIG. 4 is a graph showing the light intensity curve with the angle changes of the light emitting functional layer when L=1 um-2 um, Taper=55°, THK=1 um.

Please refer to Table 1-Table 3 and FIG. 4, when L=1 um-2 um, Taper=55°, THK=1 um, the light emitting efficiency of the light emitting functional layer 6 is increased by 3%-5%, and the shape of the overall light emitting curve of the light emitting functional layer 6 has an edge tip, but the strength of the edge tip and a central value do not exceed 0.002 (W/sr).

Figure 5:
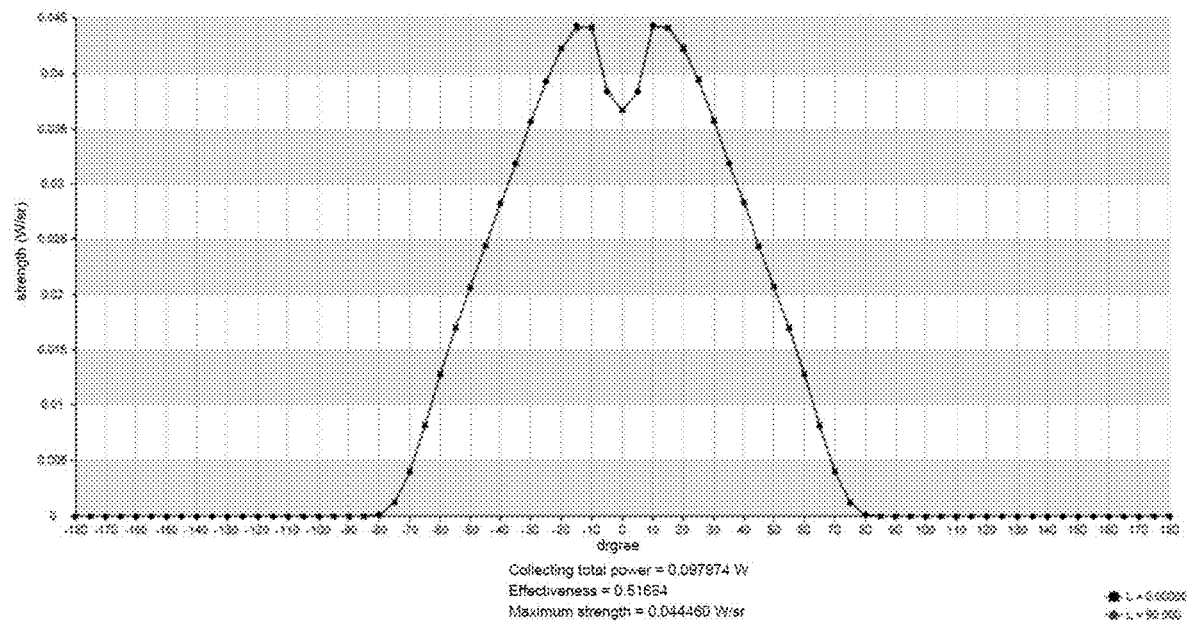
FIG. 5 is a graph showing the light intensity curve with the angle changes when a light emitting efficiency of the light emitting functional layer is greater than 5%.

Please refer to Table 1-Table 3 and FIG. 5, when the light emitting efficiency of the light emitting functional layer 6 is increased by more than 5%, the edge tip is more obvious, which may cause abnormal recognition of the human eye. Therefore, when L is selected to range from 1 um to 2 um, Taper ranges from 45° to 55°, and THK ranges from 1 um to 1.5 um can obtain the light emitting efficiency of the light emitting functional layer 6 by 2% to 5%. At this time, the light intensity curve of the light emitting functional layer 6 and the light intensity curve of the light emitting functional layer 6 of the conventional structure display panel 100 do not change much.

Therefore, in the embodiment, an angle formed between the first inclined plane 111 of the first groove 11 and an upper surface of the first planarization layer 2 ranges from 45° to 55°, and the first inclined plane 111 is an inclined plane formed by the second planarization layer 3. That is, the light shielding structure 31 of the second planarization layer 3 surrounds the first groove 11, and the first inclined plane 111 of the light shielding structure 31 forming the first groove 11 is the first inclined plane 111. The first inclined plane 111 can block the lateral light of the light emitting function layer 6, prevent the edge light leakage phenomenon, and can improve the brightness as a reflective surface, thereby further improving the light emitting efficiency of the light emitting function layer 6.

In the embodiment, an angle formed between a second inclined plane 121 of the second groove 12 and an upper surface of the anode layer 4 ranges from 45° to 55°, and the second inclined plane 121 is an inclined plane formed by the pixel defining layer 5. That is, the pixel defining layer 5 surrounds the second groove 12, and the inclined plane of the second groove 12 is the second inclined plane 121. The second inclined plane 121 is parallel to the first inclined plane 111, and can also block the lateral light of the light emitting function layer 6 to prevent the edge light leakage phenomenon.

In the embodiment, a distance between the anode layer 4 covering the first inclined plane 111 of the first groove 11 and the adjacent light emitting functional layer 6 ranges from 1 um to 2 um. In other words, the distance between the light emitting function layer 6 as a center of a light source and the anode layer 4 covering the first inclined plane 111, and the angle formed between the first inclined plane 111 and the upper surface of the first planarization layer 2, have positive correlation to the light emitting efficiency of the light emitting functional layer 6. A reasonable distance enables the first inclined plane 111 to be used as a reflective surface to increase the brightness, thereby further improving the light emitting efficiency of the light emitting functional layer 6.

In the embodiment, a thickness of the second planarization layer 3 ranges from 1 um to 1.5 um. The size of the thickness of the second planarization layer 3 determines the size of a reflective surface of the first inclined plane 111, thereby affecting its ability to block the lateral light of the light emitting functional layer 6 and prevent the edge light leakage phenomenon, and the size of the reflective surface is directly related to improve the brightness and the light emitting efficiency of the light emitting functional layer 6. Reasonable thickness range of the second planarization layer 3 can block the lateral light of the light emitting function layer 6, thereby preventing the edge light leakage phenomenon and improving the brightness as the light reflecting surface, thereby further improving the light emitting efficiency of the light emitting function layer 6.

In the embodiment, a cross-sectional shape of the first groove 11 or a cross-sectional shape of the second groove 12 is an inverted trapezoid. That is, a cross section of the light shielding structure 31 is a right-angle trapezoid, and a cross section of the pixel defining layer 5 is also a right-angle trapezoid. The top view shapes of the first groove 11 and the second groove 12 are in the shape of a diamond, a circle, a triangle, a rectangle or a polygon.

Figure 6:
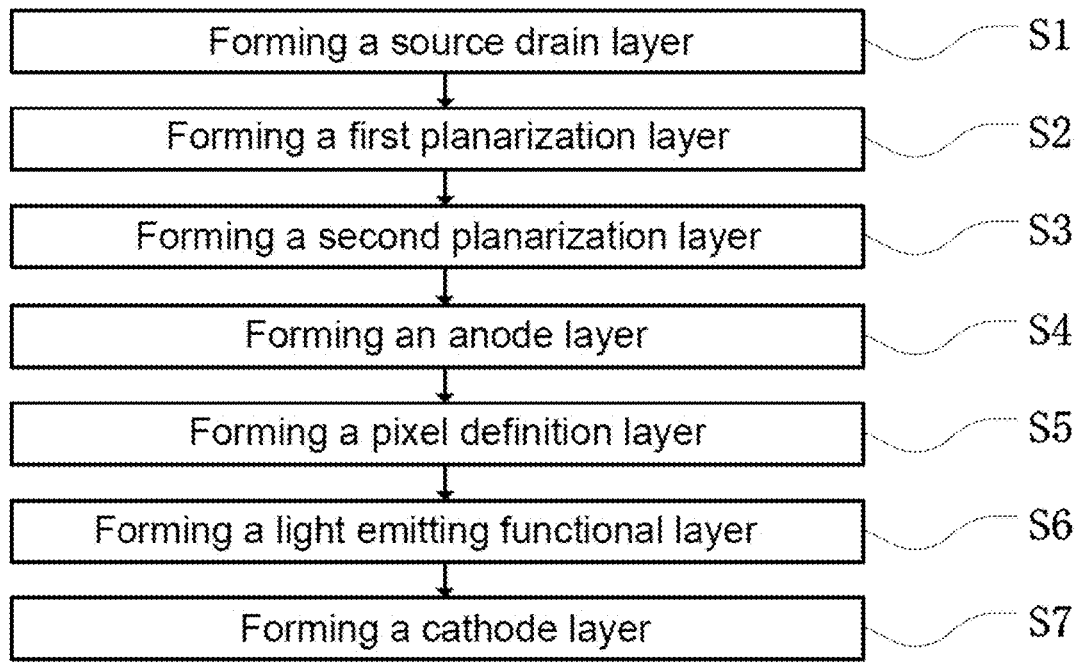
FIG. 6 is a manufacturing method of a display panel according to an embodiment of the present invention.

Referring to FIG. 6, the present invention further provides a manufacturing method of the display panel 100, which comprises the following steps S1-S7:

S1, forming a source drain layer 1;

S2, forming a first planarization layer 2 on the source drain layer 1;

S3, forming a second planarization layer 3 on the first planarization layer 2 and patterning the second planarization layer 3, wherein the patterned second planarization layer 3 has a light shielding structure 31 and a first groove 11 is formed by the light shielding structure 31;

S4, forming an anode layer 4 on the second planarization layer 3, wherein the anode layer 4 completely covers the first groove 11 and is extended to cover a portion of the second planarization layer 3;

S6, forming a light emitting functional layer 6 on the anode layer 4 in the first groove 11; and S7, forming a cathode layer 7 on the light emitting functional layer 6 in the first groove 11.

The first planarization layer 2 is formed with a via 21 through etching, and the anode layer 4 is electrically connected to the source drain layer 1 through the via 21.

Referring to FIG. 6, in the embodiment, after the step S4 of forming the anode layer and before the step S6 of forming the light emitting functional layer, further comprises:

S5, forming a pixel definition layer 5 on the second planarization layer 3 and the anode layer 4, wherein the first groove 11 forms a second groove 12 after partially filling the pixel defining layer 5, the second groove 12 is disposed around the first groove 11, and the anode layer 4 is exposed on a bottom surface of the second groove 12. Wherein the light emitting function layer 6 is disposed on the anode layer 4 in the second groove 12, and the cathode layer 7 is disposed on the light emitting function layer 6 in the second groove 12.

In the embodiment, an angle formed between the first inclined plane 111 of the first groove 11 and an upper surface of the first planarization layer 2 ranges from 45° to 55°, and the first inclined plane 111 is an inclined plane formed by the second planarization layer 3. That is, the light shielding structure 31 of the second planarization layer 3 surrounds the first groove 11, and the first inclined plane 111 of the light shielding structure 31 forming the first groove 11 is the first inclined plane 111. The first inclined plane 111 can block the lateral light of the light emitting function layer 6, prevent the edge light leakage phenomenon, and can improve the brightness as the reflective surface, thereby further improving the light emitting efficiency of the light emitting function layer 6.

In the embodiment, an angle formed between a second inclined plane 121 of the second groove 12 and an upper surface of the anode layer 4 ranges from 45° to 55°, and the second inclined plane 121 is an inclined plane formed by the pixel defining layer 5. That is, the pixel defining layer 5 surrounds the second groove 12, and the inclined plane of the second groove 12 is the second inclined plane 121. The second inclined plane 121 is parallel to the first inclined plane 111, and can also block the lateral light of the light emitting function layer 6 to prevent the edge light leakage phenomenon.

Compared with the conventional manufacturing method of the OLED display panel, in the embodiment, only a mask for manufacturing the second planarization layer 3 needs to be added. Thus, the light emitting efficiency of the light emitting function layer 6 and the edge light leakage phenomenon of the light emitting function layer 6 can be increased without changing the material thereof, and the method is simple and the cost is low.

In the embodiment, a distance between the anode layer 4 covering the first inclined plane 111 of the first groove 11 and the adjacent light emitting functional layer 6 ranges from 1 um to 2 um. In other words, the distance between the light emitting function layer 6 as the center of the light source and the anode layer 4 covering the first inclined plane 111, and the angle formed between the first inclined plane 111 and the upper surface of the first planarization layer 2, have positive correlation to the light emitting efficiency of the light emitting functional layer 6. A reasonable distance enables the first inclined plane 111 to be used as a reflective surface to increase the brightness, thereby further improving the light emitting efficiency of the light emitting functional layer 6.

In the embodiment, a thickness of the second planarization layer 3 ranges from 1 um to 1.5 um. The size of the thickness of the second planarization layer 3 determines the size of the reflective surface of the first inclined plane 111, thereby affecting its ability to block the lateral light of the light emitting functional layer 6 and prevent the edge light leakage phenomenon, and the size of the reflective surface is directly related to improve the brightness and the light emitting efficiency of the light emitting functional layer 6. Reasonable thickness range of the second planarization layer 3 can block the lateral light of the light emitting function layer 6, thereby preventing the edge light leakage phenomenon and improving the brightness as the light reflecting surface, thereby further improving the light emitting efficiency of the light emitting function layer 6.

Based on the same inventive concept, an embodiment of the present invention provides a display device comprising the display panel 100 provided by the above embodiment. The display device in the embodiment of the present invention may be any products or components having a display function, such as mobile phones, tablet computers, televisions, displays, notebooks, digital photo frames, navigators, and the like.

A working principle of the display device provided in the embodiment is consistent with a working principle of the embodiment of the display panel 100. For the specific structural relationship and working principle, refer to the foregoing embodiment of the display panel 100, and details are not described herein again.

The beneficial effects of the invention are: providing the display panel 100, the display device, and the manufacturing method of the display panel 100, and providing the second planarization layer 3 on an outer side of the pixel defining layer 5 around a light emitting functional layer 6 for blocking the lateral light of the light emitting function layer 6, thereby preventing the edge light leakage phenomenon; and further adjusting the tilt angle of the second planarization layer 3 adjacent to the light emitting function layer 6, and adjusting a distance from an edge of the second planarization layer 3 to the light emitting function layer 6, thereby improving the light emitting efficiency of the OLED display panel 100, which reduces source powers and power consumption, and increases battery lives.

It should be noted that, for the sake of clarity, only the structure for explaining the technical solution is shown in the drawings of the present disclosure. In the actual product, it is also possible to add, delete or deform on the basis of the drawings of the present disclosure to the extent possible without affecting the realization of the technical solution. The above description is only a preferred embodiment of the present disclosure, and is not intended to limit the present disclosure. Any modifications, equivalent substitutions, improvements, etc. made within the spirit and principles of the present disclosure are intended to be included within the scope of the present disclosure.

The above is only a preferred embodiment of the present invention. It should be noted that many modifications and refinements can be made by those skilled in the art without departing from the principles of the invention, and such improvements and modifications should also be considered as the scope of protection of the present invention.

What is claimed is:

1. A display panel, comprising:
   a source drain layer;
   a first planarization layer disposed on the source drain layer;
   a second planarization layer patterned and disposed on the first planarization layer, wherein the second planarization layer comprises a light shielding structure and a first groove formed by the light shielding structure;
   an anode layer disposed on the second planarization layer, wherein the anode layer completely covers the first groove and is extended to cover a portion of the second planarization layer;
   a light emitting functional layer disposed on the anode layer in the first groove; and
   a cathode layer disposed on the light emitting functional layer in the first groove.

2. The display panel as claimed in claim 1, wherein an angle formed between a first inclined plane of the first groove and an upper surface of the first planarization layer ranges from 45° to 55°, and the first inclined plane is an inclined plane formed by the second planarization layer.

3. The display panel as claimed in claim 1, further comprising:
   a pixel defining layer disposed on the second planarization layer and the anode layer, wherein the first groove forms a second groove after partially filling the pixel defining layer, the second groove is disposed around the first groove, and the anode layer is exposed on a bottom surface of the second groove;
   wherein the light emitting functional layer is disposed on the anode layer in the second groove; and
   wherein the cathode layer is disposed on the light emitting functional layer in the second groove.

4. The display panel as claimed in claim 3, wherein an angle formed between a second inclined plane of the second groove and an upper surface of the anode layer ranges from 45° to 55°, and the second inclined plane is an inclined plane formed by the pixel defining layer.

5. The display panel as claimed in claim 3, wherein a cross-sectional shape of the first groove or a cross-sectional shape of the second groove is an inverted trapezoid.

6. The display panel as claimed in claim 1, wherein a distance between the anode layer covering the first inclined plane of the first groove and the adjacent light emitting functional layer ranges from 1 um to 2 um.

7. The display panel as claimed in claim 1, wherein a thickness of the second planarization layer ranges from 1 um to 1.5 um.

8. A display device, comprising the display panel as claimed in claim 1.

9. A manufacturing method of a display panel, comprising the following steps:
   forming a source drain layer;
   forming a first planarization layer on the source drain layer;
   forming a second planarization layer on the first planarization layer and patterning the second planarization layer, wherein the patterned second planarization layer has a light shielding structure and a first groove is formed by the light shielding structure;
   forming an anode layer on the second planarization layer, wherein the anode layer completely covers the first groove and is extended to cover a portion of the second planarization layer;
   forming a light emitting functional layer on the anode layer in the first groove; and
   forming a cathode layer on the light emitting functional layer in the first groove.

10. The manufacturing method of the display panel as claimed in claim 9, wherein after the step of forming the anode layer and before the step of forming the light emitting functional layer further comprises:
    forming a pixel definition layer on the second planarization layer and the anode layer, wherein the first groove forms a second groove after partially filling the pixel defining layer, the second groove is disposed around the first groove, and the anode layer is exposed on a bottom surface of the second groove;
    wherein the light emitting function layer is disposed on the anode layer in the second groove, and the cathode layer is disposed on the light emitting function layer in the second groove.

* * * * *